United States Patent
Cheng et al.

(10) Patent No.: US 9,583,628 B2
(45) Date of Patent: Feb. 28, 2017

(54) SEMICONDUCTOR DEVICE WITH A LOW-K SPACER AND METHOD OF FORMING THE SAME

(71) Applicant: GLOBALFOUNDRIES Inc., Grand Cayman (KY)

(72) Inventors: Kangguo Cheng, Schenectady, NY (US); Bruce B. Doris, Slingerlands, NY (US); Ali Khakifirooz, Los Altos, CA (US); Douglas C. La Tulipe, Jr., Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 78 days.

(21) Appl. No.: 14/558,904

(22) Filed: Dec. 3, 2014

(65) Prior Publication Data
US 2015/0137240 A1    May 21, 2015

Related U.S. Application Data

(62) Division of application No. 13/354,363, filed on Jan. 20, 2012, now Pat. No. 9,034,701.

(51) Int. Cl.
| | |
|---|---|
| *H01L 27/12* | (2006.01) |
| *H01L 29/786* | (2006.01) |
| *H01L 29/772* | (2006.01) |
| *H01L 29/66* | (2006.01) |
| *H01L 29/08* | (2006.01) |

(Continued)

(52) U.S. Cl.
CPC ..... *H01L 29/78603* (2013.01); *H01L 29/0847* (2013.01); *H01L 29/495* (2013.01); *H01L 29/4908* (2013.01); *H01L 29/517* (2013.01); *H01L 29/518* (2013.01); *H01L 29/6653* (2013.01); *H01L 29/66545* (2013.01); *H01L 29/66628* (2013.01); *H01L 29/772* (2013.01);

(Continued)

(58) Field of Classification Search
CPC ............... H01L 29/78; H01L 29/66545; H01L 29/823814
See application file for complete search history.

(56) References Cited

U.S. PATENT DOCUMENTS

| | | | |
|---|---|---|---|
| 6,348,385 | B1 | 2/2002 | Cha et al. |
| 6,531,412 | B2 | 3/2003 | Conti et al. |

(Continued)

FOREIGN PATENT DOCUMENTS

| | | |
|---|---|---|
| CN | 101764104 | 6/2010 |
| KR | 1020090104870 | 10/2009 |
| WO | 2011115773 | 9/2011 |

OTHER PUBLICATIONS

Application: GB1412524.9, Examination Report, IPO, dated Aug. 13, 2014.

(Continued)

*Primary Examiner* — Zandra Smith
*Assistant Examiner* — John M Parker
(74) *Attorney, Agent, or Firm* — Yuanmin Cai; Andrew M. Calderon; Roberts Mlotkowski Safran Cole & Calderon, P.C.

(57) ABSTRACT

A device includes a semiconductor substrate. A gate stack on the semiconductor substrate includes a gate dielectric layer and a gate conductor layer. Low-k spacers are adjacent to the gate dielectric layer. Raised source/drain (RSD) regions are adjacent to the low-k spacers. The low-k spacers are embedded in an ILD on the RSD regions.

18 Claims, 12 Drawing Sheets

(51) Int. Cl.
*H01L 29/49* (2006.01)
*H01L 29/51* (2006.01)
*H01L 29/78* (2006.01)

(52) U.S. Cl.
CPC ........ *H01L 29/785* (2013.01); *H01L 29/78654* (2013.01)

(56) References Cited

U.S. PATENT DOCUMENTS

| | | |
|---|---|---|
| 7,060,546 B2 | 6/2006 | Hsu et al. |
| 7,148,099 B2 | 12/2006 | Datta et al. |
| 7,208,361 B2 | 4/2007 | Shah et al. |
| 7,812,411 B2 | 10/2010 | Cheng |
| 7,829,943 B2 | 11/2010 | Sell |
| 7,871,869 B2 | 1/2011 | Cartier et al. |
| 7,883,951 B2 | 2/2011 | Brask et al. |
| 7,923,321 B2 | 4/2011 | Lai et al. |
| 2002/0001891 A1* | 1/2002 | Kim ............... H01L 21/28525 438/197 |
| 2005/0230749 A1 | 10/2005 | Oishi |
| 2005/0255642 A1 | 11/2005 | Liu et al. |
| 2006/0289856 A1 | 12/2006 | Shimamune |
| 2007/0152266 A1 | 7/2007 | Doyle et al. |
| 2007/0161169 A1 | 7/2007 | Belyansky et al. |
| 2009/0001480 A1 | 1/2009 | Cheng |
| 2009/0039426 A1 | 2/2009 | Cartier et al. |
| 2009/0085123 A1 | 4/2009 | Sato |
| 2009/0108352 A1* | 4/2009 | Majumdar .......... H01L 29/4908 257/347 |
| 2010/0062577 A1 | 3/2010 | Liao |
| 2010/0065926 A1 | 3/2010 | Yeh et al. |
| 2010/0112798 A1 | 5/2010 | Lai |
| 2010/0156510 A1 | 6/2010 | Botula et al. |
| 2011/0042744 A1 | 2/2011 | Cheng et al. |
| 2011/0227159 A1 | 9/2011 | Chan et al. |
| 2012/0043623 A1 | 2/2012 | Doris et al. |
| 2013/0032859 A1 | 2/2013 | Pei |
| 2013/0240990 A1 | 9/2013 | Yin et al. |
| 2013/0292767 A1* | 11/2013 | Yang ................... H01L 27/1211 257/347 |
| 2014/0167164 A1 | 6/2014 | Adam et al. |
| 2015/0194501 A1* | 7/2015 | Yin ................... H01L 29/66545 438/300 |

OTHER PUBLICATIONS

International Search Report/Written Opinion; PCT/US2013/021357; Apr. 29, 2013.

Elbert Huang, et al., "Low-k Spacers for Advanced low Power CMOS Devices with Reduced Parasitic Capacitances," 2008 IEEE International SOI Conference Proceedings, pp. 19-20.

\* cited by examiner ed in multiple steps. After formation of the raised source/

SEMICONDUCTOR DEVICE WITH A LOW-K SPACER AND METHOD OF FORMING THE SAME

BACKGROUND OF THE INVENTION

The present invention relates generally to a semiconductor device and method of manufacturing the same and, more specifically, to a structure and method for manufacturing a semiconductor device with a low-k spacer.

As semiconductor device dimensions aggressively shrink, the adverse impact of parasitics such as gate-to-contact parasitic capacitance and fringing capacitance on device performance becomes more and more severe, particularly for semiconductor devices with a raised source/drain (RSD) such as an extremely thin silicon on insulator (ETSOI), FinFET or nanowire device. An ETSOI, FinFET or nanowire device requires a RSD to lower source/drain (S/D) resistance. Reducing parasitic capacitance is critical for improving AC performance while maintaining low power.

SUMMARY OF THE INVENTION

In a first aspect of the invention, a device includes a semiconductor substrate. The device includes a gate stack on the semiconductor substrate, the gate stack including a gate dielectric layer on the semiconductor substrate and a gate conductor layer on the gate dielectric layer. The device includes low-k spacers adjacent to the gate dielectric layer. The device further includes raised source/drain (RSD) regions adjacent to the low-k spacers. The device also includes an ILD layer on the RSD regions and the low-k spacers, wherein the ILD layer overhangs the low-k spacers.

In a yet further aspect of the invention, a design structure tangibly embodied in a machine readable medium for designing, manufacturing, or testing an integrated circuit, the design structure includes a gate stack on a semiconductor substrate, the gate stack including a gate dielectric layer on the semiconductor substrate and a gate conductor layer on the gate dielectric layer. The design structure includes low-k spacers adjacent to the gate dielectric layer. The design structure further includes raised source/drain (RSD) regions adjacent to the low-k spacers. The design structure also includes an ILD layer on the RSD regions and the low-k spacers, wherein the ILD layer overhangs the low-k spacers.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

An embodiment of this invention provides a method and structure for forming a MOSFET with a RSD and an embedded low-k spacer with a replacement high-k/metal gate. An ETSOI device is shown as an exemplary device to illustrate different aspects of the method and structure disclosed in this invention; however, it will be clear to those skilled in the art that the method in this invention can be applied to any MOSFET structure with a RSD, such as bulk or PDSOI MOSFET with RSD. It will also be clear to those skilled in the art that even though three-dimensional (3-D) MOSFET structures, such as FinFET, frigate or nanowire are non-planar, after formation of RSD and as long as middle of the line (MOL) is concerned, there is no difference between these devices and a planar device structure. Hence, the method disclosed in this invention is equally applicable to such 3-D device structures, such as FinFET, trigate or nanowire MOSFETs in which RSD may sometimes be referred to as merged source/drain (MSD).

Figure 1:
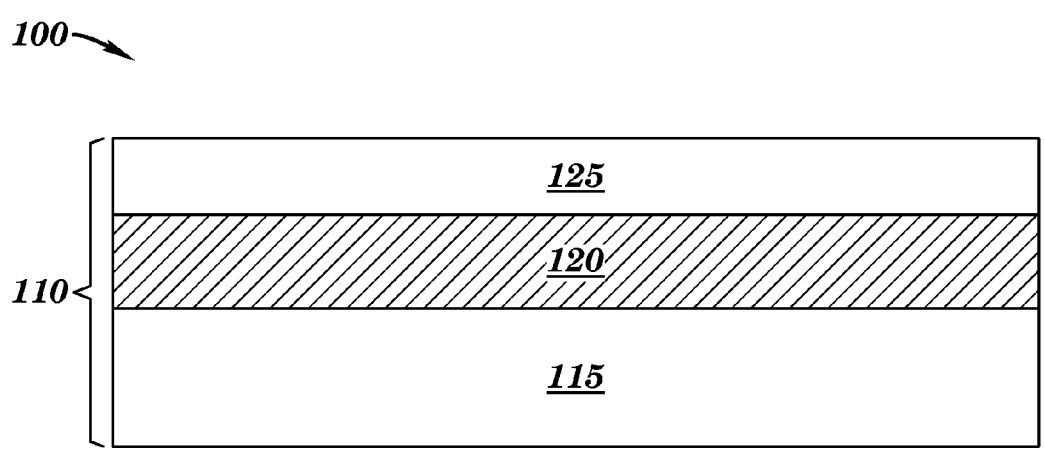
FIG. 1 shows a starting structure in accordance with an embodiment of the invention.

FIG. 1 shows a starting structure 100 in accordance with an embodiment of the invention. In one embodiment, starting structure 100 includes a semiconductor-on-insulator (SOI) substrate 110. SOI substrate 110 includes substrate layer 115, buried oxide (BOX) layer 120 and ETSOI layer 125. Substrate layer 115 may comprise silicon, silicon germanium, or other materials or combinations of materials. Generally, ETSOI layer 125 may have a thickness in a range from about 3 nm to about 10 nm, but may be thicker or thinner. The starting structure 100 may include other substrates such as a bulk semiconductor substrate which may comprise silicon, germanium, silicon germanium, silicon carbide, and those consisting essentially of III-V compound semiconductors, and/or II-VI compound semiconductors. The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. Some portions or the entire portion of the starting structure 100 may be doped, undoped or contain doped regions and undoped regions therein. The semiconductor substrate may contain regions with strain and regions without strain therein, or contain regions of tensile strain and compressive strain. The semiconductor structure 100 may further include other device features such as isolation, wells, and/or other features formed in early process steps. For simplicity, ETSOI is used as an exemplary embodiment thereafter, although other structures are also explicitly conceived.

Figure 2:
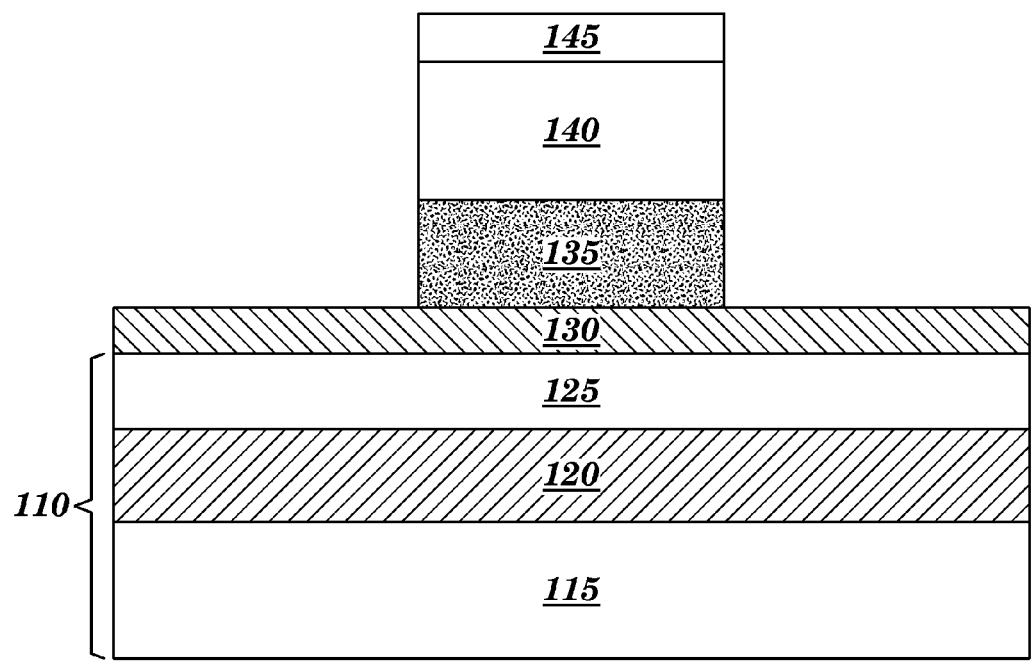
FIGS. 2-10 show processing steps and intermediate structures in accordance with an embodiment of the invention.

Referring to FIG. 2, a dummy gate stack 111 is formed on ETSOI layer 125 using conventional processes known in the art such as deposition, lithographic patterning and etching. In one embodiment, dummy gate stack 111 includes gate oxide 130, polysilicon gate 135, nitride cap 140 and oxide cap 145. Other suitable materials can also be used for dummy gate stack 111.

Figure 3:
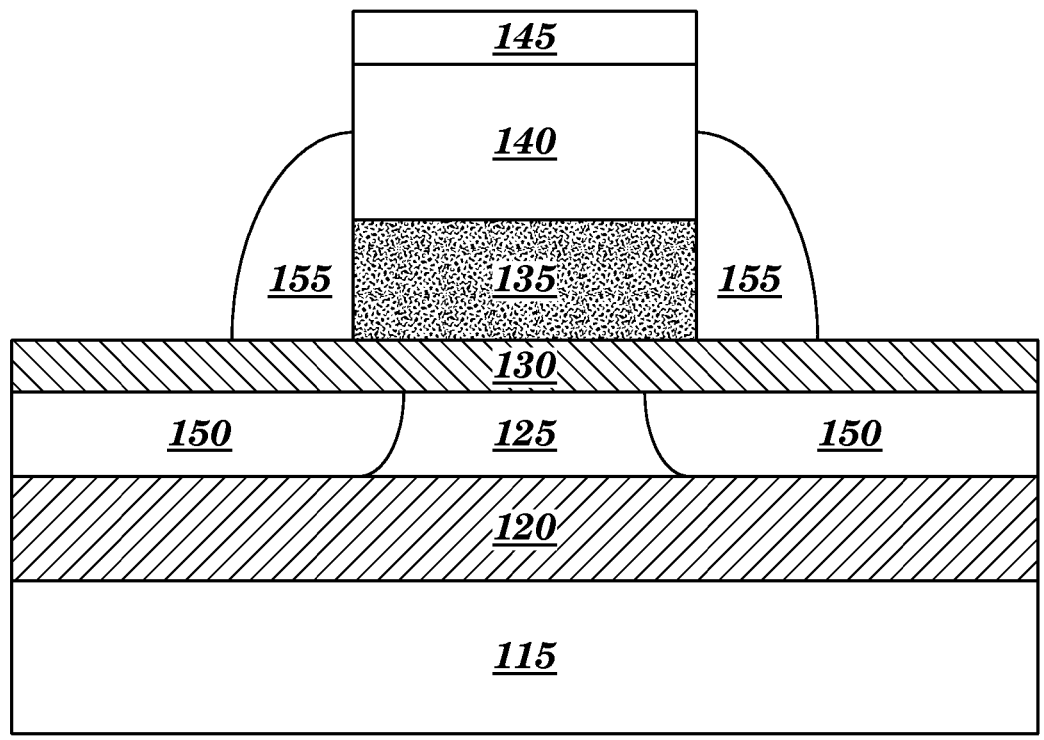

Referring to FIG. 3, extensions 150 are formed in ETSOI layer 125 using conventional processes known in the art such as implantation, plasma doping, solid phase doping and the like. Dummy spacers 155 are formed on each side of dummy gate stack 111 using conventional processes known in the art such as depositing a nitride material and performing a reactive ion etch (RIE) selective to oxide to form and pull down the spacers.

Figure 4:
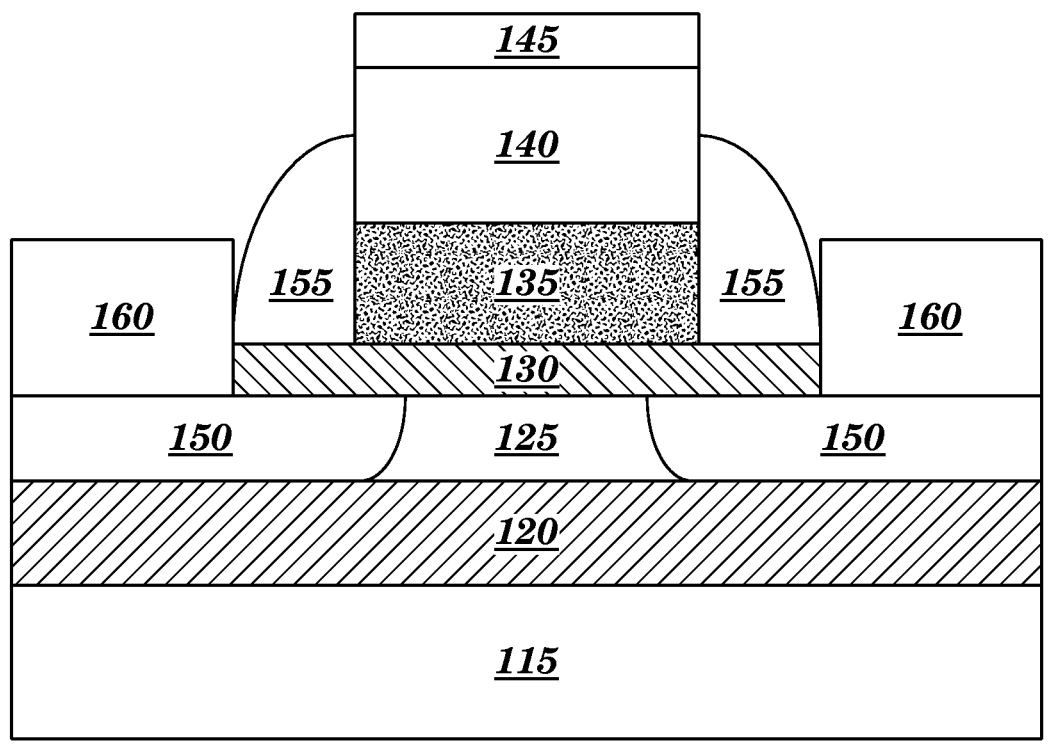

Referring to FIG. 4, raised source/drain (RSD) regions 160 are formed on extensions 150 in the ETSOI layer 125 of SOI substrate 110 on each side of dummy gate stack 111 using conventional processes known in the art such as doping and epitaxial growth. Alternatively, the extensions 150 and the raised source/drain regions 160 can be formed by epitaxially growing an in-situ doped semiconductor layer on the ETSOI layer and followed by a thermal anneal to have dopants diffuse from the in-situ doped layer to the underlying ETSOI layer.

Figure 5:
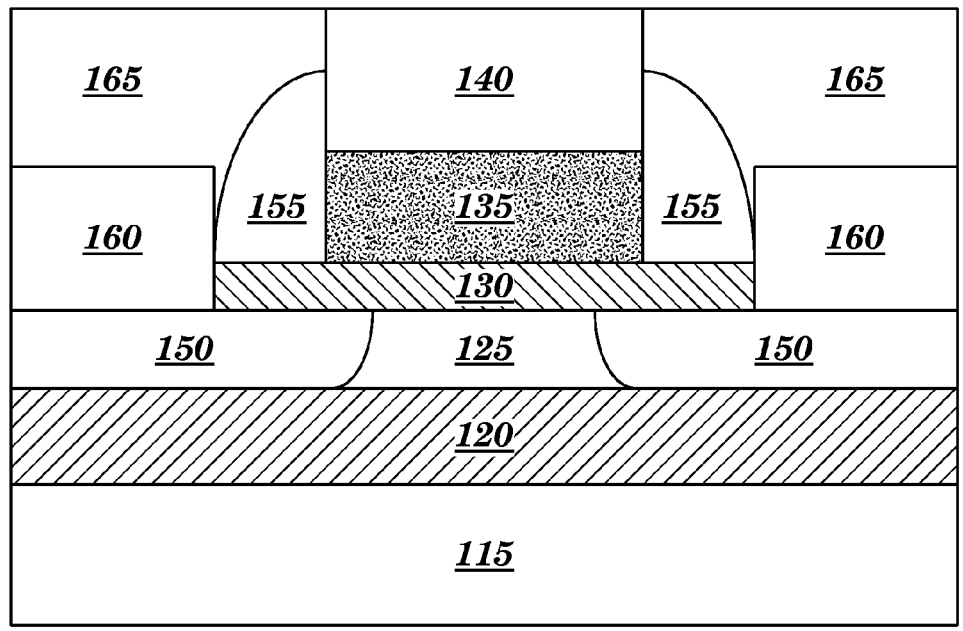

Referring to FIG. 5, an interlayer dielectric (ILD) layer 165 is deposited and polished to nitride cap 140 using conventional processes known in the art such as chemical vapor deposition (CVD). ILD layer 165 may be an oxide such as silicon oxide (SiO), doped silicon oxide (SiCOH) or other material or combinations of materials. Source/drain silicides may be formed before ILD deposition or later in the process.

Figure 6:
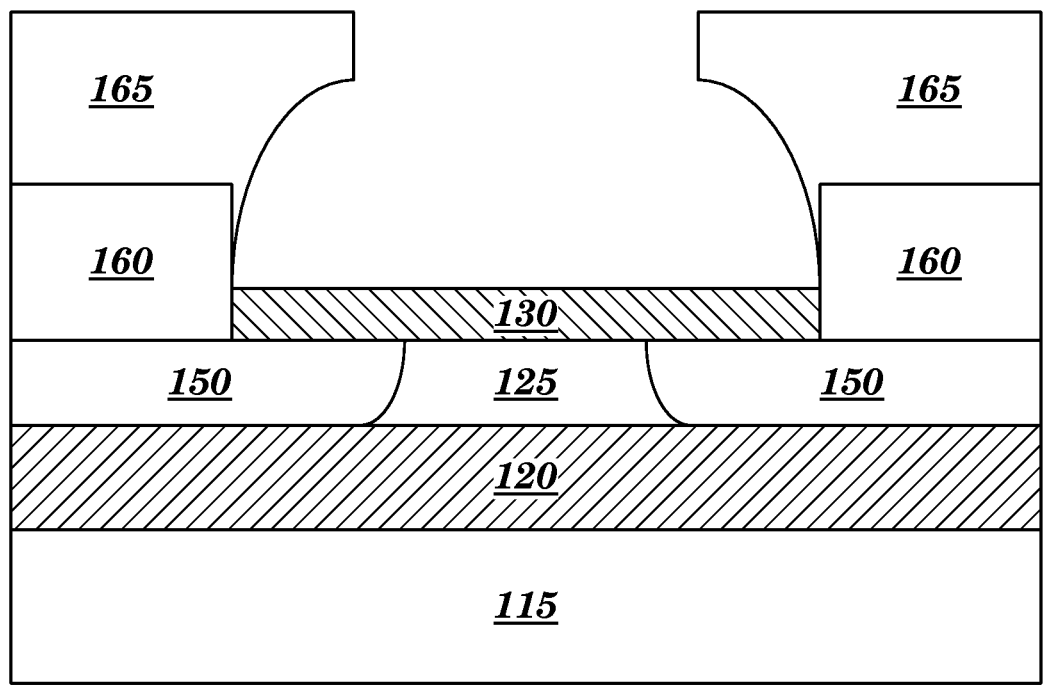

Referring to FIG. 6, nitride cap 140, polysilicon gate 135 and dummy spacers 155 are removed using conventional processes known in the art such as wet or dry etching. ILD layer 165 overhang ensures that the final gate length will essentially be the same as the dummy gate to minimize gate length variation.

Figure 7:
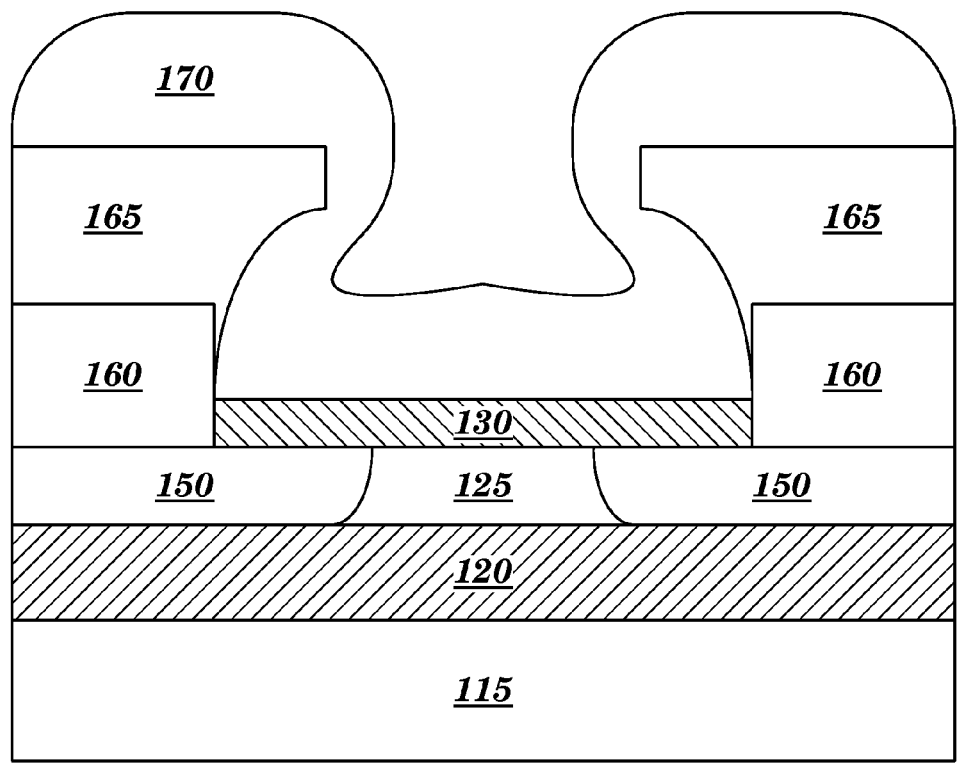

Referring to FIG. 7, a low-k material 170 is conformally deposited on ILD layer 165 and gate oxide 150. A low-k material has a dielectric constant of about 7 or less. Examples of low-k materials include, but are not limited to, hydrogen silsesquioxane polymer (HSQ), methyl silsesquioxane polymer (MSQ), polyphenylene oligomer, methyl doped silica or SiOx(CH3)y or SiCxOyHy or SiOCH, organosilicate glass (SiCOH) and porous SiCOH, silicon oxide, boron nitride, silicon oxynitride and the like. The low-k material may be deposited by using any suitable techniques including but not limited to, chemical vapor deposition and spin-on coating. An exemplary deposition process is provided as described in commonly assigned U.S. Pat. No. 6,531,412 entitled "Method for Low Temperature Chemical Vapor Deposition of Low-k films Using Selected Cyclosiloxane and Ozone Gases for Semiconductor Applications" which is incorporated by reference herein in its entirety. Alternatively, the entire dummy gate opening may be filled with a low-k material using conventional processes known in the art such as spin-on techniques (not shown).

Figure 8:
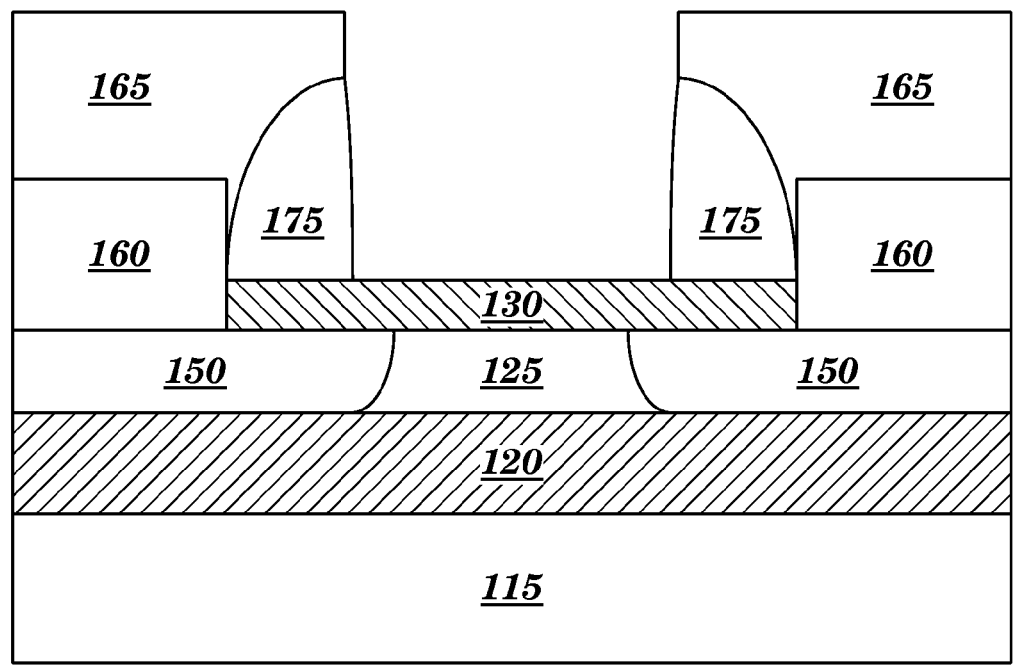

Referring to FIG. 8, low-k spacers 175 are formed using conventional processes known in the art such as RIE selective to oxide, stopping on dummy gate oxide 130. Aggressive RIE may be performed to pull down and straighten up the sidewalls of low-k spacers 175. ILD layer 165 overhang helps to minimize gate length variation during formation of low-k spacers 175. Low-k spacers 175 are embedded in ILD layer 175. If spin-on techniques were used, the low-k material may be recessed using conventional processes known in the art to form low-k spacers.

Figure 9:
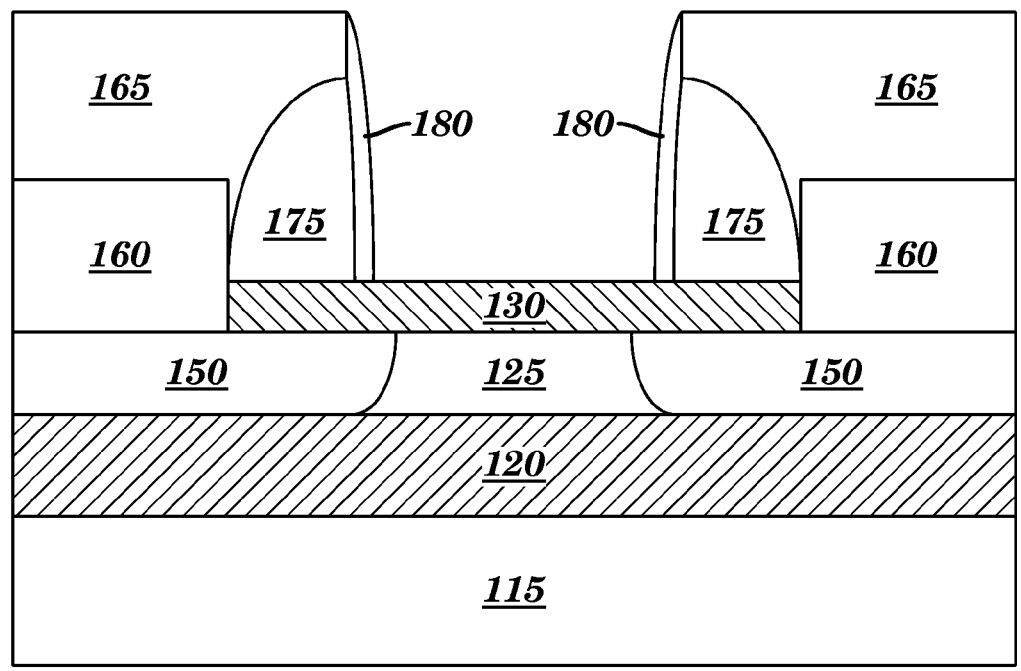

Referring to FIG. 9, optionally, if there is any concern that direct contact may occur between low-k spacers 175 and a later formed high-k gate dielectric layer, thin nitride spacers 180 may be formed using conventional processes known in the art to cover the sidewalls of low-k spacers 175 and ILD layer 165. Thin nitride spacers 180 may be deposited using an iRad (In-situ radical assisted deposition) tool commercially available from Tokyo Electron Laboratory (TEL). Thin nitride spacers 180 may be about 2 nm to about 6 nm wide, but could also be wider or narrower.

Figure 10:
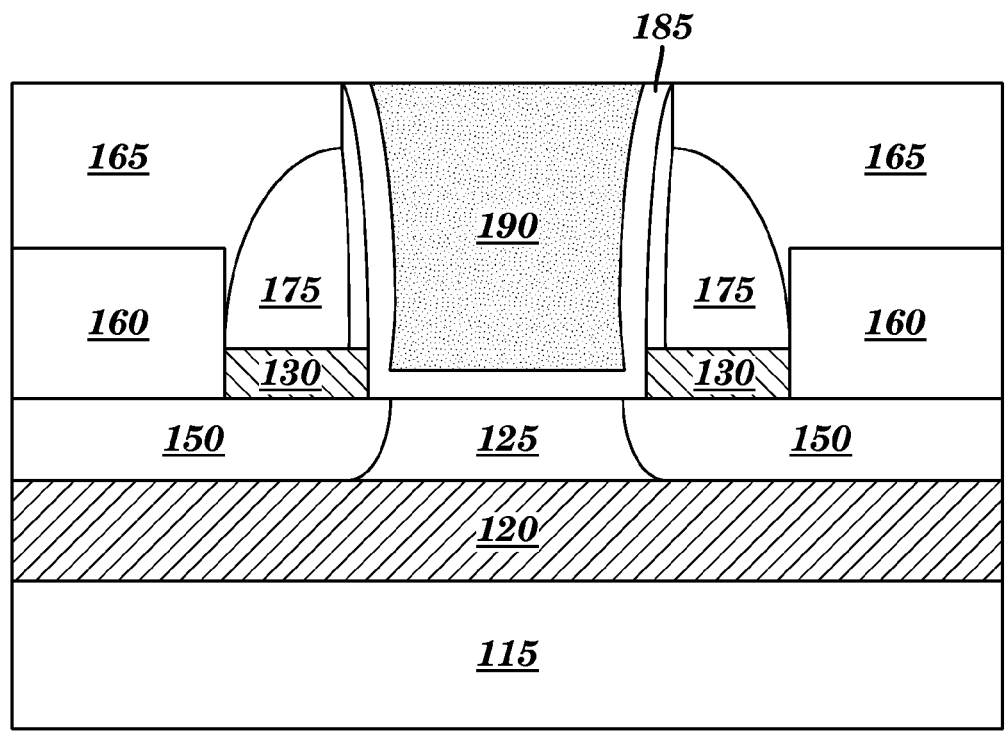

Referring to FIG. 10, gate oxide 130 is removed using conventional processes known in the art. In one embodiment, only the exposed gate oxide in the channel region is removed and a portion of the gate oxide 130 remains under low-k spacers 175. A gate dielectric layer 185 such as a high-k dielectric is formed in the dummy gate opening using conventional processes known in the art such as CVD or any known or later developed processes. Gate dielectric layer 185 may comprise hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide and lead zinc niobate. The gate dielectric may further include dopants such as lanthanum or aluminum. A thin interfacial layer (not shown) such as silicon oxide or silicon nitride, and/or silicon oxynitride may be formed between gate dielectric layer 185 and ETSOI layer 125. The interfacial layer, when presented, can be formed by chemical oxidation, low temperature oxidation, nitridation, oxynitridation and the like. The interfacial layer may have a thickness ranging from about 0.5 nm to about 1.5 nm. A gate conductor layer 190 is formed on gate dielectric layer 185. The gate conductor 190 may comprise a metal material (such as, e.g., tungsten, titanium, tantalum, ruthenium, zirconium, cobalt, copper, aluminum, lead, platinum, tin, silver and gold), a conducting metallic compound material (such as, e.g., tantalum nitride, titanium nitride, tungsten silicide, tungsten nitride, ruthenium oxide, cobalt silicide and nickel silicide), carbon nanotube, conductive carbon, polycrystalline or amorphous silicon, germanium, silicon germanium or any suitable combination of these materials. The conductive material may further comprise dopants that are incorporated during or after deposition. The gate dielectric layer and the gate conductor layer can be deposited by any conventional deposition technique including, but not limited to, atomic layer deposition (ALD), molecular layer deposition (MLD), chemical vapor deposition (CVD), low-pressure chemical vapor deposition (LP-CVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, molecular beam epitaxy (MBE), physical vapor deposition, sputtering, plating, evaporation, spin-on-coating, ion beam deposition, electron beam deposition, laser assisted deposition, chemical solution deposition, or any combination of these methods.

Figure 11:
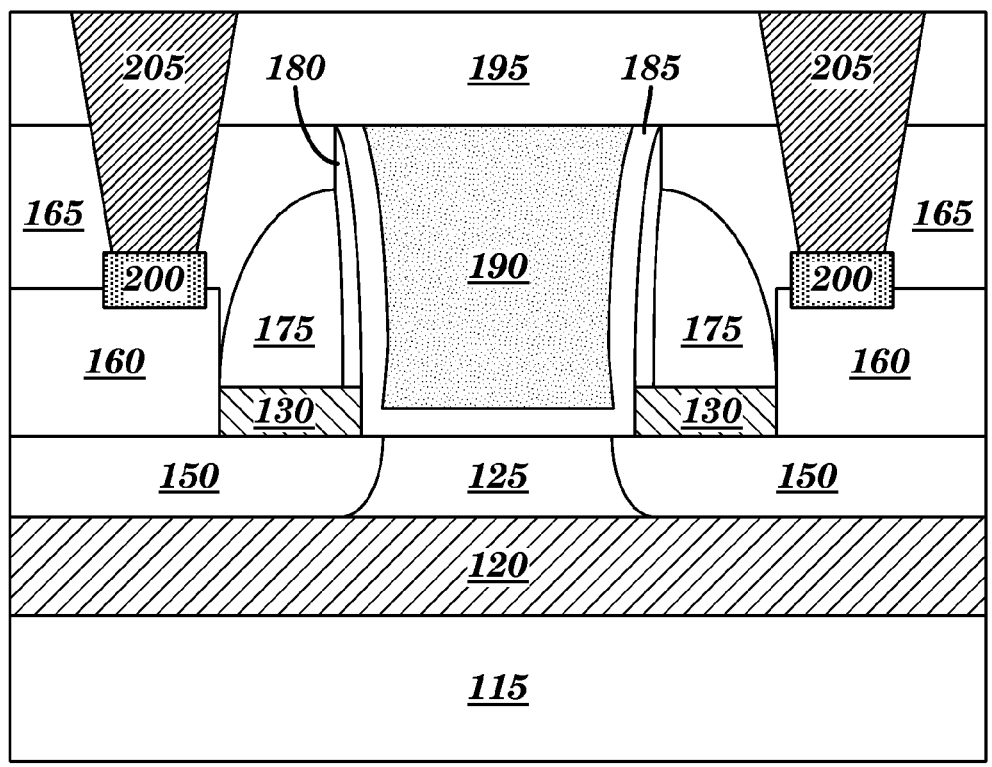
FIG. 11 shows processing steps and a final structure in accordance with an embodiment of the invention.

Referring to FIG. 11, a second ILD layer 195 is deposited on ILD layer 165, gate dielectric layer 185, gate conductor layer 190 and spacers 185 (if present) using conventional processes known in the art. ILD layer 195 may be an oxide such as silicon oxide (SiO), doped silicon oxide (SiCOH) or other material or combinations of materials. Trench silicides 200 may be formed on RSD regions 160 using conventional processes known in the art. Contacts 205 may be formed on silicides 200 using conventional processes known in the art.

Design Structure

Figure 12:
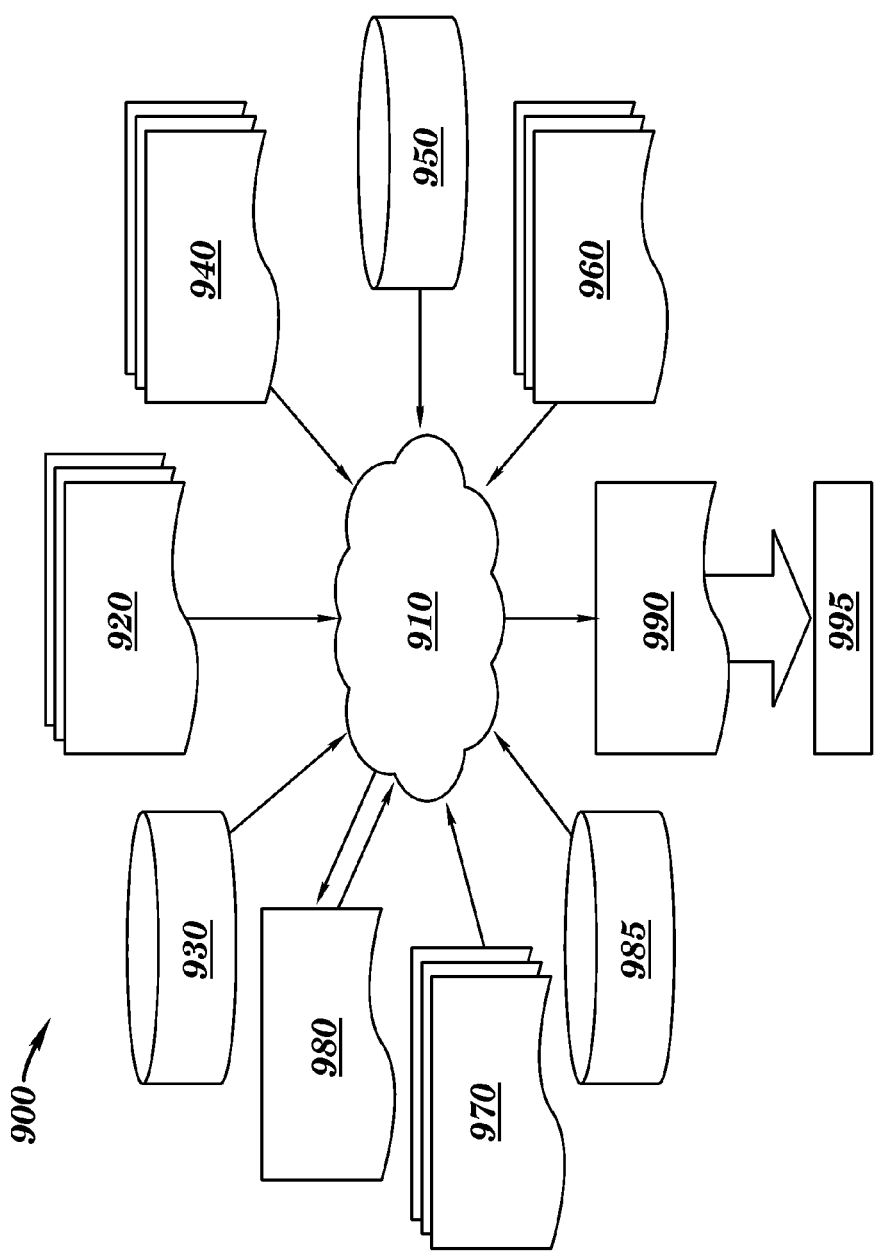
FIG. 12 shows a flow diagram of a design process used in semiconductor design, manufacture, and/or test.

FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A device, comprising:
   a semiconductor substrate;
   a gate stack on the semiconductor substrate, the gate stack including a gate conductor layer and a gate dielectric layer under the gate conductor directly on the semiconductor substrate and on sidewalls of the gate conductor layer;
   low-k spacers adjacent to the gate dielectric layer;
   raised source/drain (RSD) regions adjacent to the low-k spacers;
   an ILD layer on the RSD regions and the low-k spacers, wherein the ILD layer overhangs the low-k spacers; and
   spacers between the gate dielectric layer and the low-k spacers and between the ILD layer and the gate dielectric layer above the low-k spacers.

2. The device according to claim 1, wherein the semiconductor substrate comprises a semiconductor-on-insulator (SOI) substrate having an ETSOI layer, a BOX layer and a substrate layer.

3. The device according to claim 2, wherein the ETSOI layer has a thickness in a range from about 3 nm to about 10 nm.

4. The device according to claim 1, wherein the gate dielectric layer comprises a high-k material.

5. The device according to claim 4, wherein the high-k material is selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide and lead zinc niobate.

6. The device according to claim 1, wherein the gate conductor layer comprises a metal.

7. The device according to claim 6, wherein the metal is selected from the group consisting of:
   tungsten, titanium, tantalum, ruthenium, zirconium, cobalt, copper, aluminum, lead, platinum, tin, silver and gold.

8. The device according to claim 1, wherein the spacers are thin nitride spacers having a width in a range from about 2 nm to about 6 nm.

9. The structure of claim 1, wherein the wherein the ILD layer overhangs the low-k spacers, directly contacting an upper portion of the low-k spacers and the spacers above the low-k spacers.

10. A method in a computer-aided design system for generating a functional design model of a semiconductor device, the method comprising:
    generating a functional representation of a gate stack on the semiconductor substrate, the gate stack including a gate conductor layer and a gate dielectric layer under the gate conductor directly on the semiconductor substrate and on sidewalls of the gate conductor layer;
    generating a functional representation of low-k spacers adjacent to the gate dielectric layer;
    generating a functional representation of raised source/drain (RSD) regions adjacent to the low-k spacers;
    generating a functional representation of an ILD layer on the RSD regions and the low-k spacers, wherein the ILD layer overhangs the low-k spacers;
    generating a functional representation of spacers between the gate dielectric layer and the low-k spacers and between the ILD layer and the gate dielectric layer above the low-k spacers and
    manufacturing the semiconductor device using the generated functional representations.

11. The method according to claim 10, wherein the semiconductor substrate comprises a semiconductor-on-insulator (SOI) substrate having an ETSOI layer, a BOX layer and a substrate layer.

12. The method according to claim 11, wherein the ETSOI layer has a thickness in a range from about 3 nm to about 10 nm.

13. The method according to claim 10, wherein the gate dielectric layer comprises a high-k material.

14. The method according to claim 13, wherein the high-k material is selected from the group consisting of:
    hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide and lead zinc niobate.

15. The method according to claim 10, wherein the gate conductor layer comprises a metal.

16. The method according to claim 15, wherein the metal is selected from the group consisting of:
tungsten, titanium, tantalum, ruthenium, zirconium, cobalt, copper, aluminum, lead, platinum, tin, silver and gold.

17. The method according to claim 10, wherein the functional design model is synthesized into a netlist.

18. The method according to claim 10, wherein the spacers are nitride spacers having a width in a range from about 2 nm to about 6 nm.

* * * * *